(12) United States Patent
Kandianis et al.

(10) Patent No.: US 11,739,438 B2
(45) Date of Patent: Aug. 29, 2023

(54) METHOD OF PRODUCING METAL OXIDES WITH INCREASED ELECTRICAL CONDUCTIVITY

(71) Applicant: SHELL OIL COMPANY, Houston, TX (US)

(72) Inventors: Michael Kandianis, Houston, TX (US); Oliver Pluemper, Houten (NL)

(73) Assignee: SHELL USA, INC., Houston, TX (US)

( * ) Notice: Subject to any disclaimer, the term of this patent is extended or adjusted under 35 U.S.C. 154(b) by 715 days.

(21) Appl. No.: 16/863,078

(22) Filed: Apr. 30, 2020

(65) Prior Publication Data

US 2020/0347518 A1    Nov. 5, 2020

Related U.S. Application Data

(60) Provisional application No. 62/840,859, filed on Apr. 30, 2019.

(51) Int. Cl.
| | |
|---|---|
| *C30B 33/00* | (2006.01) |
| *C30B 33/02* | (2006.01) |
| *C01F 5/02* | (2006.01) |
| *C30B 29/16* | (2006.01) |

(52) U.S. Cl.
CPC ............... *C30B 33/02* (2013.01); *C01F 5/02* (2013.01); *C30B 29/16* (2013.01); *C01P 2002/77* (2013.01); *C01P 2006/40* (2013.01); *C01P 2006/80* (2013.01)

(58) Field of Classification Search
CPC . C30B 33/02; C30B 29/16; C01F 5/00; C01P 2002/76; C01P 2002/77; C01P 2006/40; C01P 2006/80
See application file for complete search history.

(56) References Cited

PUBLICATIONS

Manson et al., "Second-Order Raman Spectrum of MgO+", Physical Review B, vol. 3, Issue No. 6, Mar. 15, 1971, 5 pages.

*Primary Examiner* — Steven J Bos
(74) *Attorney, Agent, or Firm* — SHELL USA, INC.

(57) ABSTRACT

A method for increasing the conductivity of a metal oxide with crystal structure belonging to the 4/m 3̄2/m point group is provided. Single crystal oxides with crystal structure belonging to 4/m 3̄2/m point group are contacted with nitrogen gas, with oxygen gas, with nitrogen gas, with oxygen gas, then with nitrogen gas to increase the conductivity of the metal oxide with crystal structure belonging to the 4/m 3̄2/m point group.

9 Claims, 4 Drawing Sheets

METHOD OF PRODUCING METAL OXIDES WITH INCREASED ELECTRICAL CONDUCTIVITY

CROSS-REFERENCE TO RELATED APPLICATION

This application claims the benefit of U.S. Provisional Patent Application No. 62/840,859, filed Apr. 30, 2019, which is incorporated by reference herein in its entirety.

FIELD OF THE INVENTION

This invention relates to methods of producing metal oxides with increased electrical conductivity.

BACKGROUND OF THE INVENTION

Interactions among electrons within confined geometries give rise to some of the most fascinating properties of materials. Breakthrough discoveries that include high-temperature superconductivity, giant magnetoresistance and topological phases are notable examples. Combinations of rare and earth abundant elements alike now provide a doorway to rich phenomena where novel properties originate from the same recipe: the redistribution of electronic order in condensed matter.

Harboring distinct electronic behavior in materials ultimately depends on the symmetry state of the containing phase. But for materials that possess a center of inversion and trivial band structure, the options for electronic reshuffling are more limited. The search for novel electronic properties in these phases relies heavily on heterostructure and interface engineering that aims to amplify charge transport, incite electronic reconstruction, or sponsor correlated electron movement. Materials with modified electronic structure are necessary to fulfill a wide-variety of needs.

As an example, metal oxides of the Fm3m space group, a subset of the 4/m $\bar{3}$2/m point group, exhibit a bulk centrosymmetric character with mirror symmetry along the 110 plane. The cubic close packed arrangement of these materials arises from repeating layers of interpenetrating octahedra wherein metal atoms or O atoms rest in six-fold coordination to each other. Charge density arising from a divergence in electric fields at surface termini are inherent characteristics of these materials. An example of the geometry and charge distribution is depicted in FIG. 1 where the top-most negative charge forms a dipole oriented into the crystalline bulk of magnesium oxide (MgO) that remains uncompensated at the crystal surface.

Investigations of the electronic structure of metal oxides demonstrate that net charge density can develop within the crystalline bulk of these materials. Momentum flux and the transmission of current in the absence of electrical forcing is also possible in metal oxides; however the transport of electrons or holes in these phases is often sluggish, necessitating that pure crystalline materials be doped with transition metals. Other approaches employed to overcome the inherently low conductivities of metal oxides include: the fusion of multiple crystalline materials at a junction; the formation of metal oxide thin films; and the incorporation interstitial ions that act to mediate the transfer of charge. The challenge of developing stable materials with enhanced conductivity remains as each of these tactics can suffer from disadvantages such as lattice mismatch induced strain and impurity incorporation during fabrication.

SUMMARY OF THE INVENTION

We have found a method to increase the conductivity of oxides with crystal structure belonging to 4/m $\bar{3}$2/m point group by a certain new method of preparation In an embodiment, a method for increasing the conductivity of an oxide with crystal structure belonging to the 4/m $\bar{3}$2/m point group is provided, comprising:
(a) providing a single crystal oxide with crystal structure belonging to 4/m $\bar{3}$2/m point group,
(b) contacting the single crystal oxides with crystal structure belonging to 4/m $\bar{3}$2/m point group with nitrogen gas at a temperature in the range of at least ambient temperature to at most 80° C. thereby providing a first nitrogen contacted metal oxide;
(c) contacting the first nitrogen contacted metal oxide with oxygen gas at a temperature in the range of the range of at least ambient temperature to at most 80° C. thereby providing a first oxygen contacted metal oxide;
(d) contacting the first oxygen contacted metal oxide with nitrogen gas at a temperature in the range of the range of at least ambient temperature to at most 80° C. thereby providing a second nitrogen contacted metal oxide;
(e) contacting the second nitrogen contacted metal oxide with oxygen gas at a temperature in the range of at least 40° C. to at most 80° C. thereby providing a second oxygen contacted metal oxide; and
(f) contacting the second oxygen contacted metal oxide with nitrogen gas at a temperature in the range of at least 40° C. to at most 80° C. thereby providing the increased conductivity crystalline metal oxide with a crystal structure belonging to 4/m $\bar{3}$2/m point group oxide.

In an embodiment, the single crystal oxides with crystal structure belonging to 4/m $\bar{3}$2/m point group have a purity of at least 98%.

In an embodiment, the single crystal oxides with crystal structure belonging to 4/m $\bar{3}$2/m point group is selected from the group consisting of group 1, 2, 3, and 4 elements of the periodic table of elements.

In an embodiment, the step (b) described herein includes the nitrogen gas being contacted at a temperature in the range of at least 30° C. to at most 60° C.

In an embodiment, the step (c) described herein includes the oxygen gas being contacted at a temperature in the range of at least 30° C. to at most 60° C.

In an embodiment, the step (d) described herein includes the nitrogen gas being contacted at a temperature in the range of at least 30° C. to at most 60° C.

In an embodiment, the single crystal oxides with crystal structure belonging to 4/m $\bar{3}$2/m point group is selected from the group consisting of sodium oxide, hafnium oxide, titanium oxide, nickel oxide, manganese oxide, and all the alkaline earth metal oxides.

In an embodiment, the single crystal oxides with crystal structure belonging to 4/m $\bar{3}$2/m point group have a purity of at least 99%.

The features and advantages of the invention will be apparent to those skilled in the art. While numerous changes may be made by those skilled in the art, such changes are within the spirit of the invention.

BRIEF DESCRIPTION OF THE DRAWINGS

The drawings illustrate certain aspects of some of the embodiments of the invention, and should not be used to limit or define the invention

DETAILED DESCRIPTION OF THE INVENTION

Figure 1:
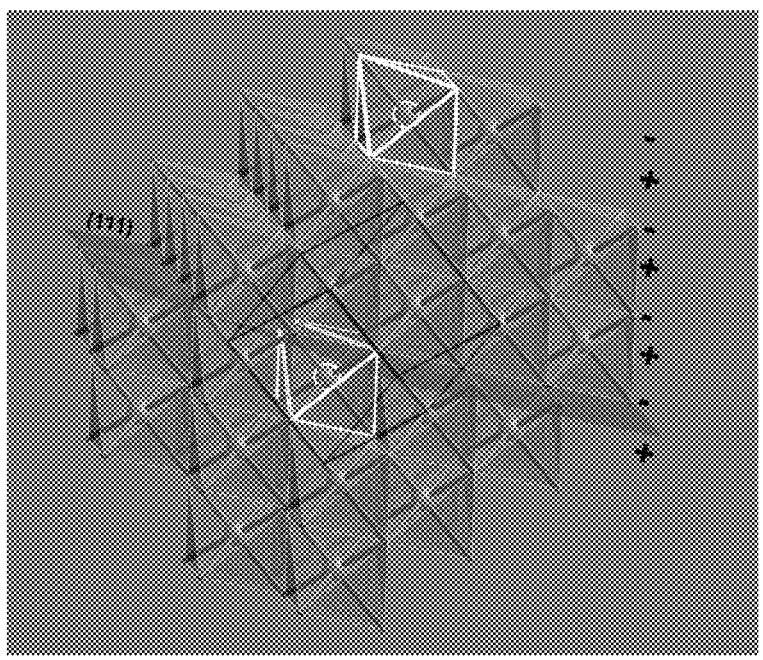
FIG. 1 depicts charge layering with [111] crystal direction of MgO, an ionic oxide with rocksalt structure.

We have found a method to increase energy flux of oxides with crystal structure belonging to 4/m $\bar{3}$2/m point group, particularly rocksalt (Fm3m) structures. More preferably oxides containing group 1, 2, 3, and 4 elements of the periodic table of elements are particularly suitable. Examples of such oxides include, sodium oxide, hafnium oxide, titanium oxide, nickel oxide, manganese oxide, and all the alkaline earth metal oxides. It is thought that the new method produces increases in energy flux by modifying the number of accessible bonding states of natural oxides.

The crystalline ionic oxides preferably have a purity of at least 98% more preferably have a purity of at least 99%, more preferably at least 99.3%, at least 99.5%, and at least 99.7%. The purity is such that it is undoped, meaning no other added metals, metalloids, alkali-metals or semi-metals beyond natural impurities.

The disruption of spatial inversion symmetry at surface termini often produces electric fields that initiate band bending and induce lattice polarization. As these fields diverge at interfaces, charge density as well as transient depolarization currents can arise in dielectric materials. Continued conduction in metal oxides requires stabilizing the channels through which charge can move. This can be achieved using a variety of approaches; however, initiating band bending such that the surface band structure can complement the intrinsic symmetry of the crystalline bulk poses a significant challenge.

To isolate the effect of surface specific fields on oxide electrical properties, we employed a modulated annealing technique that infuses oxygen into the metal oxide lattice and alters the near surface bulk to create distinct metal oxide compositions. After annealing or equilibrating single crystals in nitrogen gas ($N_2$), we explored the electronic character of the oxides using a suite of approaches specially designed to characterize bulk and surface electrical properties in situ.

There may be a shift in the bulk electrical properties of materials (FIG. 2) that undergo the maximal modulation annealing period relative to the native metal oxide. Single crystal AC conductivity values skew 1 to 1.5 orders of magnitude higher in MgO* at frequencies between 0.01 and 0.1 Hz. Second order Raman spectra (FIG. 3) of natural magnesium oxide crystal (MgO) and magnesium oxide crystal that has been treated by the modulated annealing method (MgO*), obtained with a confocal Raman microscope focused on the top-most 1000 unit cells of the oxides, confirms that the infusion of oxygen into the interface via modulation has an influence that extends into the MgO bulk. At a Raman shift of 1019 $cm^{-1}$, an energy where the doubly ($E_g$) and triply ($T_{2g}$) degenerate orbitals experience local maxima and overlap with nondegenerate ($A_{1g}$) orbitals, there is a 15% difference in the density of vibrational states (DOS). The increased DOS for metal oxides undergoing modulated annealing provides direct evidence that the novel process may modify the number of accessible bonding states and could contribute to a stable increase in conductivity in these materials.

Figure 4:
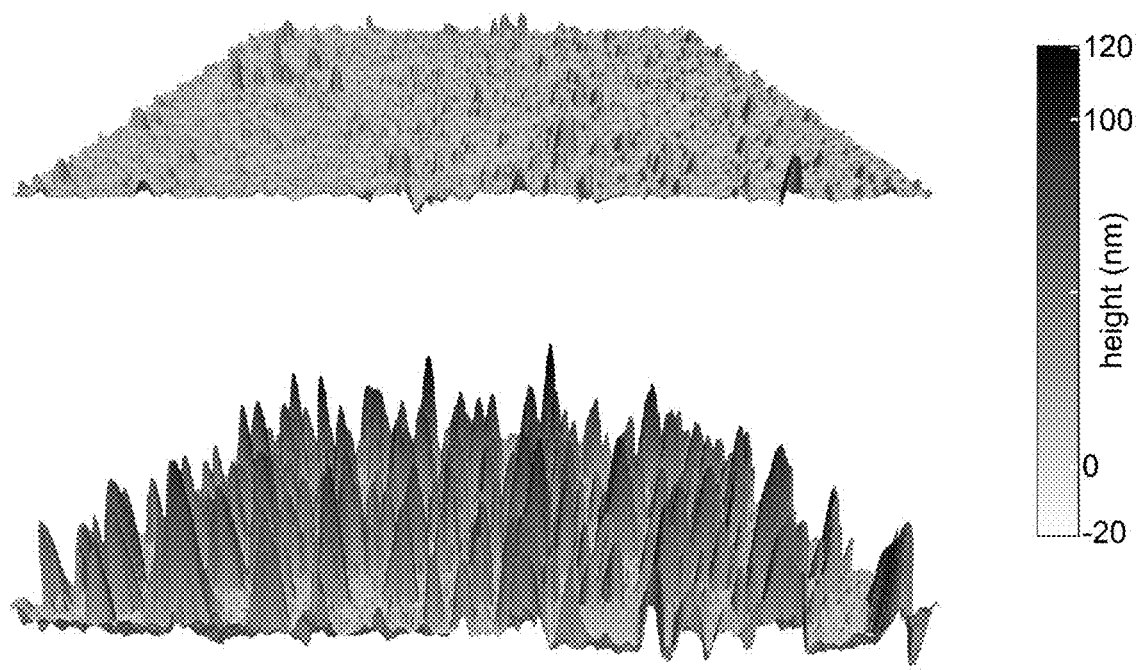
FIG. 4 shows surface microtopographic maps acquired using atomic force microscopy (AFM) as described in the Illustrative example below.

The development of growth features in MgO under conditions that disrupt the surface structure provide further evidence that modulation allows for the development of a persistent shift in the overall character this metal oxide (FIG. 4). After dissolving the crystal surfaces of MgO and MgO* with an undersaturated aqueous solution, the conductive monocrystalline magnesium oxide exhibits persistent current density that gives rise to the enhanced assembly of magnesium hydroxide ($Mg(OH)_2$) on the surface of this material relative to natural MgO (FIG. 4). This effect is directly related to the increased conductivity of the MgO* material.

To create a metal oxide single crystal belonging to 4/m $\bar{3}$2/m point group with increased conductivity, a modulated annealing can be used that ensures dry ultra-high purity (UHP) oxygen gas can permeate the metal oxide lattice beyond the surface layer. To make the increased conductive metal oxide crystal structure belonging to 4/m $\bar{3}$2/m point group novel modulated annealing method can be used. Any monocrystalline metal oxide crystal structure belonging to 4/m $\bar{3}$2/m point group of sufficient purity can be used as the starting material whether natural or synthetized. Such monocrystalline metal oxides are commercially available. The monocrystalline metal oxide is exposed to nitrogen gas (this is high purity nitrogen gas and not air), then oxygen gas (this is high purity oxygen gas and not air), then again similar nitrogen gas, then similar oxygen gas and similar nitrogen gas for an effective time to produce the increased conductivity metal oxide having a crystal structure belonging to 4/m $\bar{3}$2/m point group.

An example of preparation may involve taking a pre-cleaved single metal oxide crystal belonging to 4/m $\bar{3}$2/m point group under the constant flow of dry ultra-high purity (UHP) $N_2$ gas; and transfer the crystal to an environmentally controlled chamber under conditions where the partial pressure of water vapor is kept to a minimum (e.g., at −40° C. dew point, and 3.79 l/min flow of UHP $N_2$) heated to a temperature in a range of above ambient conditions, preferably at least 30° C., more preferably at least 35° C., but less than 80° C., preferably less than 60° C., more preferably less than 55° C., and preferably at about atmospheric pressure (e.g., 0.1 MPa pressure). Upon thermal equilibration of the crystal (e.g., over a period of 10 min) where the temperature variability of the chamber in which the crystal is located is less than 0.1° C. per minute. UHP gas flow ($N_2$ or $O_2$) is set to establish a residence time of a gas at a range of preferably 3 to 5 seconds at a constant flow rate and temperature.

In the modulated annealing process the composition of gas is varied between UHP $N_2$ and UHP $O_2$ over time in a manner consistent with the following framework; step 1-$N_2$(1) followed by step 2-$O_2$(1), step 3-$N_2$(2), step 4-$O_2$(2) and step 5-$N_2$(3). Temperature and pressure remain constant until step 4 where temperature is raised to at least 40° C. for a time effective to equilibrate the system at this new temperature (e.g., 30 min prior to the end of the step). The temperature in the final step, 5, remains at least 40° C., but less than 80° C., preferably less than 60° C., more preferably less than 55° C. and the flow rates of UHP $N_2$ are increased to residence time of $N_2$ in the range of preferably 1 to 2.5 sec for a period of at least 30 minutes up to 3 hours, preferably approximately 1 hour. After step 5, to maintain the material pure for an indefinite time, the annealed product may be kept under UHP $N_2$ flow at a residence time in the range of at least 12 seconds to at most 20 seconds. The annealed product may also be maintained at room temperature but preferably at a partial pressure of water less than $10^{-3}$ atm.

The method of increasing the conductivity of an oxide with crystal structure belonging to 4/m $\bar{3}$2/m point group is provided, comprising:

(g) providing a single crystal oxides with crystal structure belonging to 4/m $\bar{3}$2/m point group, (h) contacting the single crystal oxides with crystal structure belonging to 4/m $\bar{3}$2/m point group with nitrogen gas at a temperature in the range of at least ambient temperature to at most 80° C. (and preferably a pressure in the range of 0.1 MPa to 0.15 MPa) thereby providing a first nitrogen contacted metal oxide;

(i) contacting the first nitrogen contacted metal oxide with oxygen gas at a temperature in the range of the range of at least ambient temperature to at most 80° C. (and preferably a pressure in the range of 0.1 MPa to 0.15 MPa) thereby providing a first oxygen contacted metal oxide;

(j) contacting the first oxygen contacted metal oxide with nitrogen gas at a temperature in the range of the range of at least ambient temperature to at most 80° C. (and preferably a pressure in the range of 0.1 MPa to 0.15 MPa) thereby providing a second nitrogen contacted metal oxide;

(k) contacting the second nitrogen contacted metal oxide with oxygen gas at a temperature in the range of at least 40° C. to at most 80° C. (and preferably a pressure in the range of 0.1 MPa to 0.15 MPa) thereby providing a second oxygen contacted metal oxide; and (l) contacting the second oxygen contacted metal oxide with nitrogen gas at a temperature in the range of at least 40° C. to at most 80° C. (and preferably a pressure in the range of 0.1 MPa to 0.15 MPa) thereby providing the increased conductivity crystalline metal oxide with a crystal structure belonging to 4/m $\bar{3}$2/m point group oxide.

This modulated annealing process allowed for the alteration of the bulk crystalline structure such that the interfacial conductivity was increased. For example, in MgO, even after dissolving the crystal surface, increased current density persisted as demonstrated by the significantly higher rates growth rate of $Mg(OH)_2$ on the surface of MgO crystals upon contact with $H_2O$.

It is expected that by using the method above, the conductivity of single crystal oxides with crystal structure belonging to 4/m $\bar{3}$2/m point group will increase relative to its natural state. For example, it was found that the monocrystalline magnesium oxide produced by the above annealing method is upwards of an order of magnitude more conductive and exhibits higher energy flux. For example, monocrystalline magnesium oxide prepared by the above method has an increased Raman scattering intensity in the 1019 $cm^{-1}$ range compared to natural monocrystalline magnesium oxide measured by Raman Spectroscopy. The increase is preferably at least by 5%, more preferably 10%, even more preferably 15%. The location of the peak Raman scattering intensity in the 1019 $cm^{-1}$ range may vary depending on the instrument and excitation wavelength by about ±5 $cm^{-1}$.

While the invention is susceptible to various modifications and alternative forms, specific embodiments thereof are shown by way of examples herein described in detail. It should be understood, that the detailed description thereto are not intended to limit the invention to the particular form disclosed, but on the contrary, the intention is to cover all modifications, equivalents and alternatives falling within the spirit and scope of the present invention as defined by the appended claims. The present invention will be illustrated by the following illustrative embodiment, which is provided for illustration only and is not to be construed as limiting the claimed invention in any way.

ILLUSTRATIVE EXAMPLES

An example of the novel method of preparing metal oxides with increased conductivity is provided.

Methods

Preparing MgO Single Crystals with Increased Electrical Conductivity

To prepare magnesium oxide single crystals with distinct electrical properties, (110) oriented, ultrapure (>99.95%) magnesium oxide crystals with sizes of 5×5, 10×10 and 20×20 mm and a thickness of 0.5 mm were purchased from MTI Corporation (www.mtixtl.com). At the manufacturer, both crystal sides were polished by chemical-mechanical planarization providing minimal sub-surface damage. The surface roughness was determined to be <1 nm and all crystals were stored in a vacuum chamber prior to use. Sample preparation in the laboratory involved the following steps; (1) removal of pre-cleaved single crystal from a vacuum chamber/desiccator while keeping the material under the constant flow of dry ultra-high purity (UHP) $N_2$ gas; placement of the crystal on a glass microscope slide; and (2) immediate transferal of the oxide crystal to an environmentally controlled chamber that is held at −40° C. dew point, and 3.79 l/min flow of UHP $N_2$ gas heated to a temperature of 38.5° C. at 0.1 MPa pressure. Upon closing the chamber, thermal equilibration over a period of 10 min is established with less than 0.1° C. temperature variability per min and the UHP $N_2$ gas flow is set to 15.27 l/min constant flow rate and temperature. The modulated annealing process to produce MgO* begins wherein the composition of gas is varied between UHP $N_2$ gas and UHP $O_2$ gas over time in a manner consistent with the following framework; Gas 1-$N_2$(1) followed by Gas 2-$O_2$(1), Gas 3-$N_2$(2), Gas 4-$O_2$(2) and Gas 5-$N_2$(3). Temperature and pressure remain constant until step 4 where temperature is set to 42.5° C. at a time equivalent to 30 min prior to the end of the step. The temperature in the final step, 5, remains at 42.5° C. and flow rates of UHP $N_2$ are increased to 20.49 l/min for 1 hour. After step 5, the prepared material remains in an environmental chamber at UHP $N_2$ flow rates of 3.79 l/min, 42.5° C., 0.1 MPa and −40° C. dew point until further analysis or reaction is undertaken. The duration of interval 1 (specified here as a cycle between the midpoint of $N_2$(1) and $N_2$(2)) is denoted as $\tau_1$; and the duration of interval 2 (specified here as a cycle between the midpoint of $N_2$(2) and $N_2$(3)) is $\tau_2$. Modulated annealing occurs through the modification of $\tau_1$ and $\tau_2$ in accord with an approach that minimizes the difference frequency between intervals and maximizes the distinction between the sum frequency and the difference frequency, while ensuring both frequencies are greater than zero. If we consider that the frequencies describing intervals 1 and 2 are $f_1=1/\tau_1$ and $f_2=1/\tau_2$, respectively, we can define the time (t) dependent modulation function ($\psi(t)$) that accounts for the sum and difference frequencies as $\psi(t)=2 \sin\{\pi t(f_1+f_2)\}\cos\{\pi t(f_1-f_2)\}$. As an example, for $\tau_1$=795 min and $\tau_2$=195 min, $f_1$ and $f_2$ would equal 1/795 min and 1/195 min, respectively; the average difference frequency would equate to 32.2 µHz and the average sum frequency would equal 53.2 µHz. In this scenario, such frequency matching would yield a period (τ) of ψ(t) equivalent to 197±10 min thereby ensuring that modulated-annealing will allow for the amplification of oxygen exposure to the oxide by way of producing beats that propel dry UHP $O_2$ into the crystal while maintaining a surface layer free of excess oxygen. The process to produce MgO crystals follows the same preparatory approach, gas flow rate variations, and temperature scheme as that detailed in the modulated annealing procedure but involves the exclusive use of UHP $N_2$ gas for the entire equilibration period, and therefore exhibits no modulation.

The conductive monocrystalline magnesium oxide produced were measured by the methods mentioned below and the results provided in FIGS. 2 to 4.

Atomic Force Microscopy

Experiments were carried out in an Agilent/Keysight Technologies 5500 atomic force microscope (AFM) mounted to an environmental chamber that allows for the full control of temperature, flow rates and composition of fluid and gas atmospheres. AFM imaging was carried out using CDT-NCH and RM Platinum tips (Rocky Mountain Nanotechnology) with force constants between 65 to 115 N/m. MgO single crystals were mounted to the AFM sample plate using either vacuum grease for dry and controlled humidity experiments or a fluid cell, acting as a clamp, during the experiment. Prior to the AFM experiments, MgO crystals were exposed to varying UHP $N_2$ and $O_2$ mixtures as described in section "Preparing MgO single crystals with distinct electrical properties". For the case of fluid cell experiments, an undersaturated solution (0.0098 S/m) prepared by dissolving MgO in ultrapure MilliQ water was flowed at a rate of 5 ml/min and at a temperature of 42.5° C. across the annealed MgO crystals for durations ranging from a few minutes to many hours. During the experiment, a $N_2$ gas (0.1 MPa at 3.79 l/min) was continuously flowed through the environmental chamber. After the experiment, reacted MgO crystals were immediately submerged into liquid-$N_2$ and vacuum dried ($10^{-7}$ MPa) for up to 12 hours to sublimate all liquid from the surface and avoid post-experimental alteration of the crystals. AFM topography scans were performed on all experimentally reacted MgO crystals. Random scans of the reacted surface were conducted with a scan area of 20×20 um at a resolution of 512×512 pixels giving a pixel resolution of 39 nm. From these scans, rates of $Mg(OH)_2$ pillar assembly were calculated.

Impedance Spectroscopy

The complex impedance was measured for MgO and MgO* crystals at the frequencies 0.01 to 10 Hz using a Solatron impedance analyser (model 1260) equipped with a dielectric interface (model 1296A). The integration time was 1 cycle for 0.01-0.1 Hz, 3 cycles for 0.1-1 Hz and 1 s for 1-10 Hz. This configuration provides a smooth plot for the complex impedance in the frequency range of 0.01 to 10 Hz within a matter of minutes. After the equilibration, the MgO (110) crystals are removed from the equilibration chamber, while UHP (ultra-high purity) $N_2$ gas is sprayed on the exposed surface to reduce condensation of moisture. Both top and bottom surfaces, separated by crystals with a thickness of 0.5 mm, are covered with silver paint to create the conductive plates. Copper wires are attached to the plates and then soldered to the coaxial cables. The assembled capacitor is replaced into the equilibration chamber and complex impedance measurements are carried out only after 10 min to allow the thermal equilibration. The measurements are executed within the equilibration chamber at −40° C. dew point, and 3.79 l/min flow of UHP $N_2$ heated to a temperature of 42.5° C. at 0.1 MPa pressure. The area of the plates for the assembled capacitor with MgO (110) is estimated to be ($l_1$−1 mm) ($l_2$−1 mm), where $l_1$ and $l_2$ are the width and length of the crystal. For standard 10 mm×10 mm format the area is ~81 mm$^2$ and for a half of that it is ~36 mm$^2$. Values of the conductivity (σ) are specified using the real impedance and the dimensions of the crystals.

Raman Spectroscopy

Single (110) MgO crystals were exposed to $N_2$—$O_2$ gas mixtures or ultra-high purity $N_2$ gas in a custom-built environmental Raman cell following the equilibration procedures described in section "Preparing MgO Single Crystals with Novel Electrical Properties". Raman spectra were collected (subsample=3) from MgO* and MgO crystals (replicates=2) using a confocal WiTec alpha 300R Raman spectrometer equipped with a 600 grooves/mm grating and 488 nm laser excitation. The scattered light was collected in a 180° backscattering geometry parallel to [110] using an approach consistent with that of other investigators. Prior to the acquisition of signal from each oxide, the spectrometer was calibrated using the first order Raman band of silica at 520.7 cm$^{-1}$. The integration time for all spectra was 360 seconds.

In FIG. 1, is a schematic rendering of the crystal structure of natural magnesium oxide (MgO). The magnesium octahedra in MgO form fixed layers of charge layers at (111) surfaces and exhibit a repeating symmetry (highlighted in white) that is characteristic of ionic oxides with rocksalt structure. Positively charge layers (+) and negatively charged layers (−) co-align with magnesium atoms [at center of each octahedron (spheres)] and oxygen atoms [at octahedral edges (not shown)] respectively. In charge neutral lattices, a divergence in polarization develops along the [111] crystal direction at surfaces as the bulk lattice cannot compensate the terminal layer.

Figure 2:
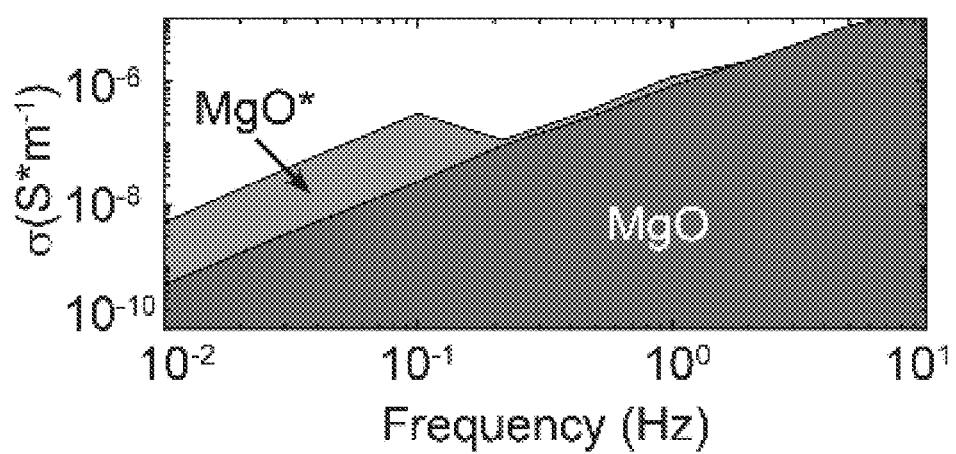
FIG. 2 is a graph showing the dependence of the electrical conductivity (σ) on frequency for natural magnesium oxide (MgO) and conductive monocrystalline magnesium oxide (MgO*).

In FIG. 2, the dependence of the electrical conductivity (σ) on frequency for natural magnesium oxide (MgO) and conductive monocrystalline magnesium oxide (MgO*). In the frequency range of 0.01 Hz to 0.1 Hz, MgO* is upwards of twelve times more conductive than natural MgO, thereby revealing the influence of the novel process on the electrical properties of crystalline materials belonging to the 4/m $\overline{3}$2/m point group.

Figure 3:
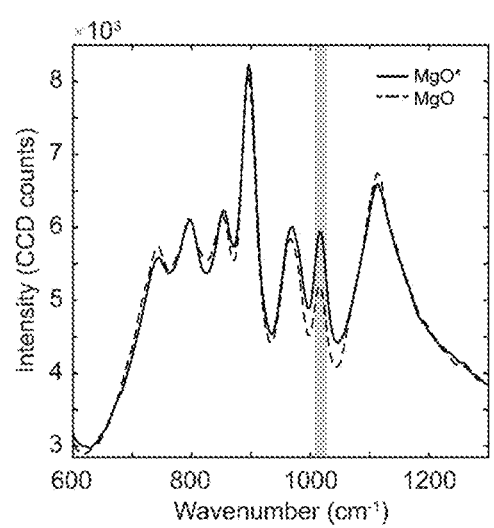
FIG. 3 is a second order Raman spectrum of an annealed metal oxide, MgO* and MgO; Raman scattering intensity is plotted versus Raman shift as measured in wavenumber ($cm^{-1}$) for both materials.

In FIG. 3, the second order Raman spectrum of MgO* and MgO. Raman scattering intensity varies with Raman shift as measured in wavenumber (cm$^{-1}$) in both materials. The second order spectrum of MgO arises from points of high density of states (DOS) near the critical points in the Brillouin zone (Manson, et al, 1971). A significantly increased intensity in the 1019 cm$^{-1}$ Raman mode (grey area) demonstrates that MgO* has an increased vibrational DOS at this energy and, as a result, a larger number of accessible bonding states.

In FIG. 4, surface microtopographic maps acquired using atomic force microscopy (AFM). $Mg(OH)_2$ pillar structures grown from an undersaturated aqueous solution flowing at 5 mL/min over a natural MgO crystal (top) and a conductive monocrystalline MgO* (bottom) for 150 minutes illustrate the distinctive conductive properties of the inventive annealing process. Seven-fold higher growth rates and the continual assembly of pillars after the removal of tens of nanometers of the crystal demonstrate that the increased conductivity of the inventive method produces changes in current density that are resilient to large scale reconstruction of the crystal surface.

We claim:

1. A method for increasing the conductivity of an oxide with crystal structure belonging to the $4/m\,\bar{3}2/m$ point group comprising:
   (a) providing a single crystal metal oxide with crystal structure belonging to $4/m\,\bar{3}2/m$ point group,
   (b) contacting the single crystal metal oxide with crystal structure belonging to $4/m\,\bar{3}2/m$ point group with nitrogen gas at a temperature in the range of at least ambient temperature to at most 80° C. thereby providing a first nitrogen contacted metal oxide;
   (c) contacting the first nitrogen contacted metal oxide with oxygen gas at a temperature in the range of at least ambient temperature to at most 80° C. thereby providing a first oxygen contacted metal oxide;
   (d) contacting the first oxygen contacted metal oxide with nitrogen gas at a temperature in the range of at least ambient temperature to at most 80° C. thereby providing a second nitrogen contacted metal oxide;
   (e) contacting the second nitrogen contacted metal oxide with oxygen gas at a temperature in the range of at least 40° C. to at most 80° C. thereby providing a second oxygen contacted metal oxide; and
   (f) contacting the second oxygen contacted metal oxide with nitrogen gas at a temperature in the range of at least 40° C. to at most 80° C. thereby providing an increased conductivity crystalline metal oxide with a crystal structure belonging to $4/m\,\bar{3}2/m$ point group oxide.

2. The method of claim 1 wherein the single crystal metal oxide with crystal structure belonging to $4/m\,\bar{3}2/m$ point group have a purity of at least 98%.

3. The method of claim 1 wherein the single crystal metal oxide with crystal structure belonging to $4/m\,\bar{3}2/m$ point group contains an element selected from the group consisting of group 1, 2, 3, and 4 elements of the periodic table of elements.

4. The method of claim 2 wherein the single crystal metal oxide with crystal structure belonging to $4/m\,\bar{3}2/m$ point group contains an element selected from the group consisting of group 1, 2, 3, and 4 elements of the periodic table of elements.

5. The method of claim 1 wherein in step (b) the nitrogen gas is contacted at a temperature in the range of at least 30° C. to at most 60° C.

6. The method of claim 5 wherein in step (c) the oxygen gas is contacted at a temperature in the range of at least 30° C. to at most 60° C.

7. The method of claim 6 wherein in step (d) the nitrogen gas is contacted at a temperature in the range of at least 40° C. to at most 60° C.

8. The method of claim 1 wherein the single crystal metal oxide with crystal structure belonging to $4/m\,\bar{3}2/m$ point group is selected from the group consisting of sodium oxide, hafnium oxide, titanium oxide, nickel oxide, manganese oxide, and all the alkaline earth metal oxides.

9. The method of claim 2 wherein the single crystal metal oxide with crystal structure belonging to $4/m\,\bar{3}2/m$ point group have a purity of at least 99%.

* * * * *